United States Patent [19]

Moller et al.

[11] Patent Number: 4,610,004
[45] Date of Patent: Sep. 2, 1986

[54] EXPANDABLE FOUR-PORT REGISTER FILE

[75] Inventors: Ole H. Moller; Paul Po Loi Chu, both of Sunnyvale, Calif.

[73] Assignee: Advanced Micro Devices, Inc., Sunnyvale, Calif.

[21] Appl. No.: 659,390

[22] Filed: Oct. 10, 1984

[51] Int. Cl.[4] .............................................. G11C 8/00
[52] U.S. Cl. ................................................ 365/230
[58] Field of Search ......................... 365/189, 190, 230

[56] References Cited

U.S. PATENT DOCUMENTS 4,125,877 11/1978 Reinert ................................ 365/190

Primary Examiner—James W. Moffitt
Attorney, Agent, or Firm—Patrick T. King; Kenneth B. Salomon

[57] ABSTRACT

A two read-port, two write-port register file on a single integrated circuit chip provides dual read/write access via either an "A"-side or a "B"-side of a single array of addressable registers. Separate on-chip "A"-side and "B"-side multiplexers permit reading or writing of an independently addressed register according to the phase of the "A"-side or "B"-side clock. Writing can be selectively effected to either a high-order and/or a low-order byte within the addressed register. Unidirectional busses connect each register to each of the four ports. The register can be expanded to provide a four read-port, two write-port register file such as is required for the parallel computation of addresses and data.

6 Claims, 2 Drawing Figures

EXPANDABLE FOUR-PORT REGISTER FILE

CROSS-REFERENCE TO RELATED APPLICATION

Related copending application of particular interest to this invention is application Ser. No. 667,022, filed Oct. 31, 1984 on behalf of Michael Allen and Lee Hirsch entitled "Dual Port Read/Write RAM with Single Array" and assigned to the assignee of the instant application.

This invention relates generally to storage elements used in programmable digital devices and, more particularly, to an expandable dual-access register file having two read ports and two write ports providing independent read/write access of any register from any port.

BACKGROUND OF THE INVENTION

Many programmable digital devices, such as microprocessors, have a shared dual-access scratch-pad memory. For example, when two such microprocessors share a message buffer between them, each processor needs both a read and a write port.

Thus, so-called duel-access memories are commonly-employed in programmable digital devices. Presently, these memories are constructed from a number of separate integrated circuit chips which will typically include a pair of separate single-access memory chips with a multiplexer on a third chip connected to the input ports of the memories. Access to one or the other of the memories is controlled by a memory switching signal applied to the multiplexer.

The presence of an external multiplexer has a number of undesirable consequences: an overhead time penalty is added to all memory accesses and more complex timing control requirements are necessitated by the need to apply the memory switching signal sufficiently in advance of the access to allow stabilization of the signal paths passing through the multiplexer; in many instances a separate multiplexer switching clock was used.

Even if these undesirable consequences are considered manageable, a further difficulty with the use of two single-access memories and the inter-memory switching multiplexer is that this arrangement does not permit independent reading and writing, from both the input ports and the output ports, as may be needed in a particular application. Presently, another off-chip multiplexer is used to switch from read to write address. The use of an external read/write multiplexer entails further difficulties: additional timing signals were necessitated, usually supplied by a separate write clock which had a critical ten nanosecond timing window during which the address signal must stabilize in order to avoid race conditions. This was a major nuisance in the design of a working memory.

Further, since it is desirable to be able to access the data stored in any given location from either port, the data must be replicated in both single-access memories. In prior art memories of this construction, an additional clock phase is typically added to transfer data written into a given location in one of the single-access memories to the other single-access memory, thereby imposing a significant time overhead in the cycle time of the memory.

The use of a number of separate chips to form the dual-access memory increases the cost of fabrication due to the large number of terminal pins which must be interconnected and decreases the access speed, over and above that already mentioned, due to inter-chip signal propagation delay.

Additionally, present dual-access memories use bi-directional busses to connect the individual storage locations to a single set of terminals used for both input and output. This technique is slow in that it requires a reversal of the bi-directional busses for each access cycle.

Finally, present memories support byte-oriented operations through the use of separate memories, one for each byte. This method involves duplication of much of the peripheral elements supporting the memories resulting in more expensive device with a greater number of pin interconnections.

In another application, a four read-port, two write port memory is to be shared by a two-input arithmetic-logic (ALU) and a two-input multiplier processor. In this case, two read ports are connected to the input of the ALU and the remaining two read ports are connected to the inputs of the multiplier. The ALU output is connected to one of the memory write ports and the multiplier output to the other write port of the memory. Thus, it is desirable to be able to expand in a parallel manner a dual-access memory so that arithmetic addition and subtraction by the ALU can be performed in parallels with multiplication and division by the multiplier.

SUMMARY OF THE INVENTION

The present invention provides a true two read-port, two write-port register file, each port served with a dedicated unidirectional bus permitting simultaneous dual read/write access from both read or write ports. The invention is embodied as a single integrated circuit chip having on-chip peripheral elements and a single-array on-chip dual-access read/write random access memory (RAM). The four-port register file of the present invention is expandable to form a two write-port, four read-port register file, for example, as required to perform parallel address and data computation.

The register file permits dual read/write access through an "A"-side and a "B"-side and employs dual on-chip address multiplexers to affect independent transitions from read to write on the "A"- and "B"-sides. The presence of these on-chip multiplexers improves access time and eliminates the need for a second separate write clock and removes the attendant timing criticality concerns. Furthermore, the novel single-array on-chip dual-access RAM utilized in the register file of the present invention eliminates the need for a memory switching multiplexer on the input ports because the RAM used in the present invention is of a novel design employing storage cells all of which are in direct communication with all four ports. Hence data at either input port can be written into any register within the RAM or read from any register via either output port.

The related copending application Ser. No. 667,022, filed Oct. 13, 1984, on behalf of Michael Allen and Lee Hirsch entitled "Dual Port Read/Write RAM with Single Array" and assigned to the assignee of the instant invention is hereby incorporated by reference into the instant application and contains a complete description of the RAM and the novel storage cell employed therein.

The RAM consists, in one embodiment of the invention, of 64 eighteen-bit registers, each having an individually-writable low- and high-order byte. A pair of on-chip AND gates at each of the "A"-and "B"-sides receive write low-byte and write high-byte signals. Using the "A"-side for illustrative purposes, the "A"-side receives a write clock signal conducted to the "A"-side read/write multiplexer and to the "A"-side AND gates where it does double-duty by controlling the write enable AND gates, simultaneous permitting a write address to pass the multiplexer, in one phase and in the other phase disables the write enable gates, simultaneously permitting the read address to pass the multiplexer. The register file of the present invention thus permits byte-oriented operations by providing independent access of the upper 9 bits and the lower 9 bits of any register to be written individually.

The use of unidirectional busses and the two independent input ports provided by the single-array dual access RAM, permits two register files of the present invention to be operated in parallel to form a two write-port, four read-port register file.

DESCRIPTION OF AN ILLUSTRATIVE EMBODIMENT

The expandable dual-, simultaneous-, random-access integrated circuit register file of the present invention consists of a novel configuration of on-chip peripheral elements and a novel single-array read/write dual-, random-access memory. The number of read ports and write ports, the size in words of the register file and the number of bits per word in the file may vary from implementation to implementation while still providing the various benefits of the invention.

Figure 1:
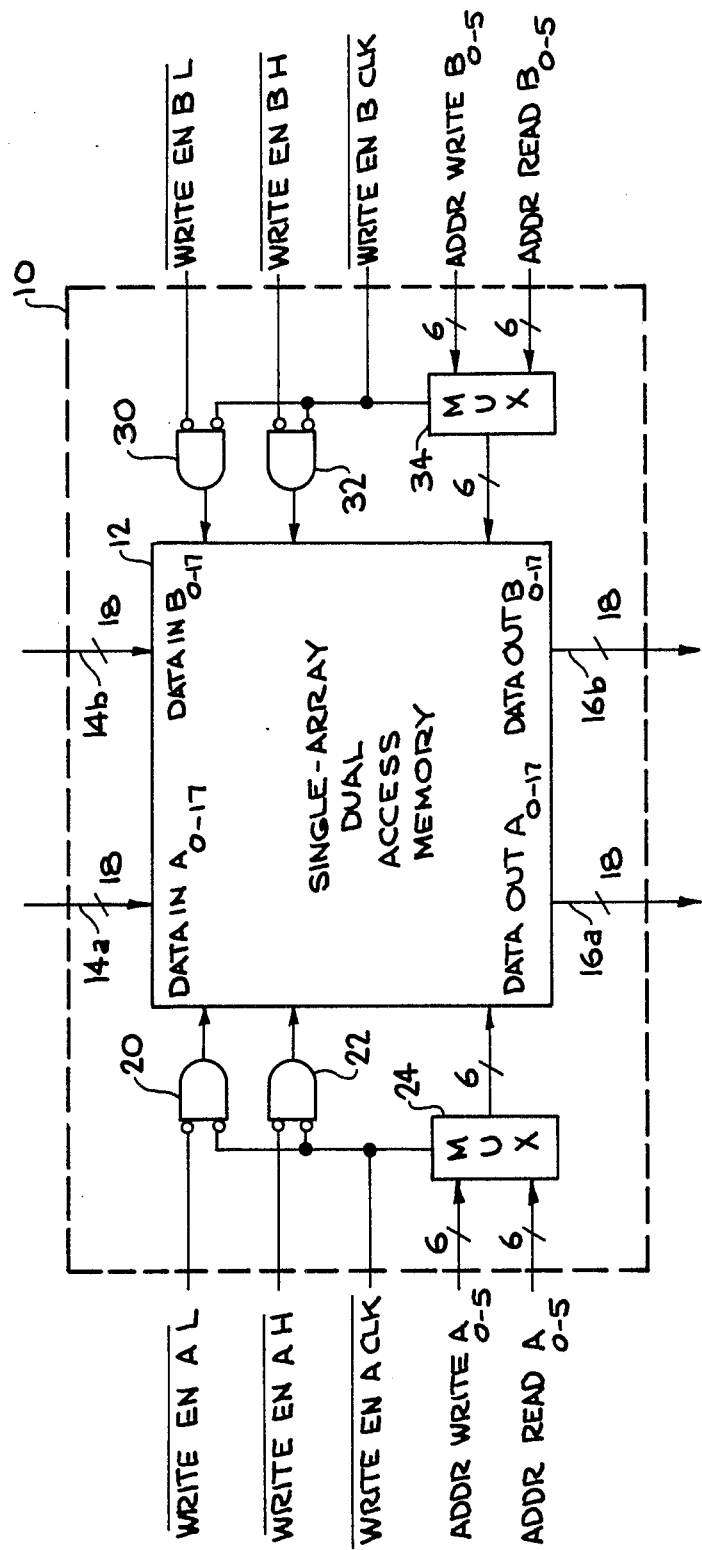
FIG. 1 is a block diagram of the expandable single-chip four port register file of the present invention.

FIG. 1 illustrates one such implementation of an expandable register file 10 constructed in accordance with the teachings of the present invention. It is realized as a single integrated circuit chip and, as illustrated, comprises a two read-port, two write-port, single-array, random access memory 12 having dual read/write access provided via an "A"-side, and a "B"-side, address control consisting of AND gates 20 and 22 and multiplexer (MUX) 24, and AND gates 30 and 32 and multiplexer (MUX) 34, respectively.

Memory 12 receives at a write port DATA—IN—$A_{0-17}$ an eighteen-bit data word conducted to the memory via a unidirectional data bus 14a and at a write port DATA—$IN_{13}$ $B_{0-17}$ an eighteen-bit data word conducted in the memory via a unidirectional data bus 14b. Memory 12 presents at a pair of read ports, DATA—OUT—$A_{0-17}$ and DATA—OUT—$B_{0-17}$, eighteen-bit data words which are conducted from the memory 12 via a pair of unidirectional data busses, 16a and 16b, respectively.

The "A"-side and "B" side of memory 12 provide independent, simultaneous, random access to any register within the memory. As the "A" side and "B"-side address controls function identically, only the operation of the "A"-side address control will now be described. Memory 12 comprises a single array of 64 addressable registers, each register capable of storing an eighteen-bit word consisting of a low-order byte comprising bits 0 through 8 and a high-order byte comprising bits 9 through 17. Either the low- or high-order byte of a register can be independently accessed during writing via an inverted write enable low byte ($\overline{WRITE\_EN\_A\_L}$) or write enable high byte ($\overline{WRITE\_EN\_A\_H}$) signal applied to an inverted input of the AND gate 20 or AND gate 22, respectively.

In a typical application, the four-port register file 10 would be used in a programmable digital device such as a microprocessor which employs a system clock to effect synchronous operation of the microprocessor. The signal generated by the clock is communicated to the register file 10 as an inverted write enable clock ($\overline{WRITE\_EN\_A\_CLK}$) signal and applied to an inverted input of AND gates 20 and 22, and to a non-inverted input of the MUX 24. The MUX 24 selects, under the control of the WRITE—EN—A—CLK signal, the particular 6-bit write address (ADDR—WRITE—$A_{0-5}$) or read address (ADDR—READ—$A_{0-5}$) applied to the MUX 24, to effect either a write or a read, respectively, of the register of memory 12 at the specified address.

During the period when the WRITE—EN—A—CLK signal is a HIGH, the AND gates 20 and 22 conduct the WRITE—EN—A—L and WRITE—EN—A—H control signals, respectively, to the memory 12 and the MUX 24 conducts the 6-bit ADDR—WRITE—$A_{0-5}$ address to the memory 12. When the WRITE—EN—A—CLK signal is a LOW, the AND gates 20 and 22 are disabled and LOW write enable control signals are conducted to the memory 12 and the MUX 24 conducts the 6-bit ADDR—READ—$A_{0-5}$ signal to the memory 12.

The application of a HIGH write enable "A" control signal for a low- and/or high-order byte of a register specified by a write "A" address applied to the memory 12 causes the low- and/or high-order byte, respectively, of the data word at the DATA—IN—$A_{0-17}$ port to be destructively written to the specified byte(s) of the specified register within memory 12. Similarly, the application of a LOW write enable "A" control signal for a low- and/or high-order byte inhibits writing of the low- and/or high-order byte, respectively, at the DATA—IN—$A_{0-17}$ port to the corresponding byte of the specified register.

When the WRITE_EN_A_CLK signal is a LOW, the eighteen-bit contents of the register specified by a read "A" address applied to the memory 12 is nondestructively read out and conducted to the DATA_OUT_A$_{0-17}$ port of the memory 12.

Since the register file 10 of the instant invention permits the application of independent clock signals at the "A"-and "B"-sides, a given register could be written into, from side "A" for instance, and read from, from side "B" for instance, simultaneously. In this case the value read is the value written. Alternatively, a given register could be written from both the "A"-side and the "B"-side at the same time. In this case the value written is undefined. Of course, a given register can be read from both sides simultaneously with consistent resulting values.

The single-array dual-access memory 12 is preferable constructed from emitter-coupled logic (ECL) integrated circuitry and can be fabricated to be externally compatible either with transistor-transistor logic (TTL) or ECL. The preferred embodiment of memory 12 is described in related copending application Ser. No. 667,022, filed Oct. 31, 1984, on behalf of Michael Allen and Lee Hirsch entitled "Dual Port Read/Write RAM with Single Array" and assigned to the assignee of the instant application.

Figure 2:
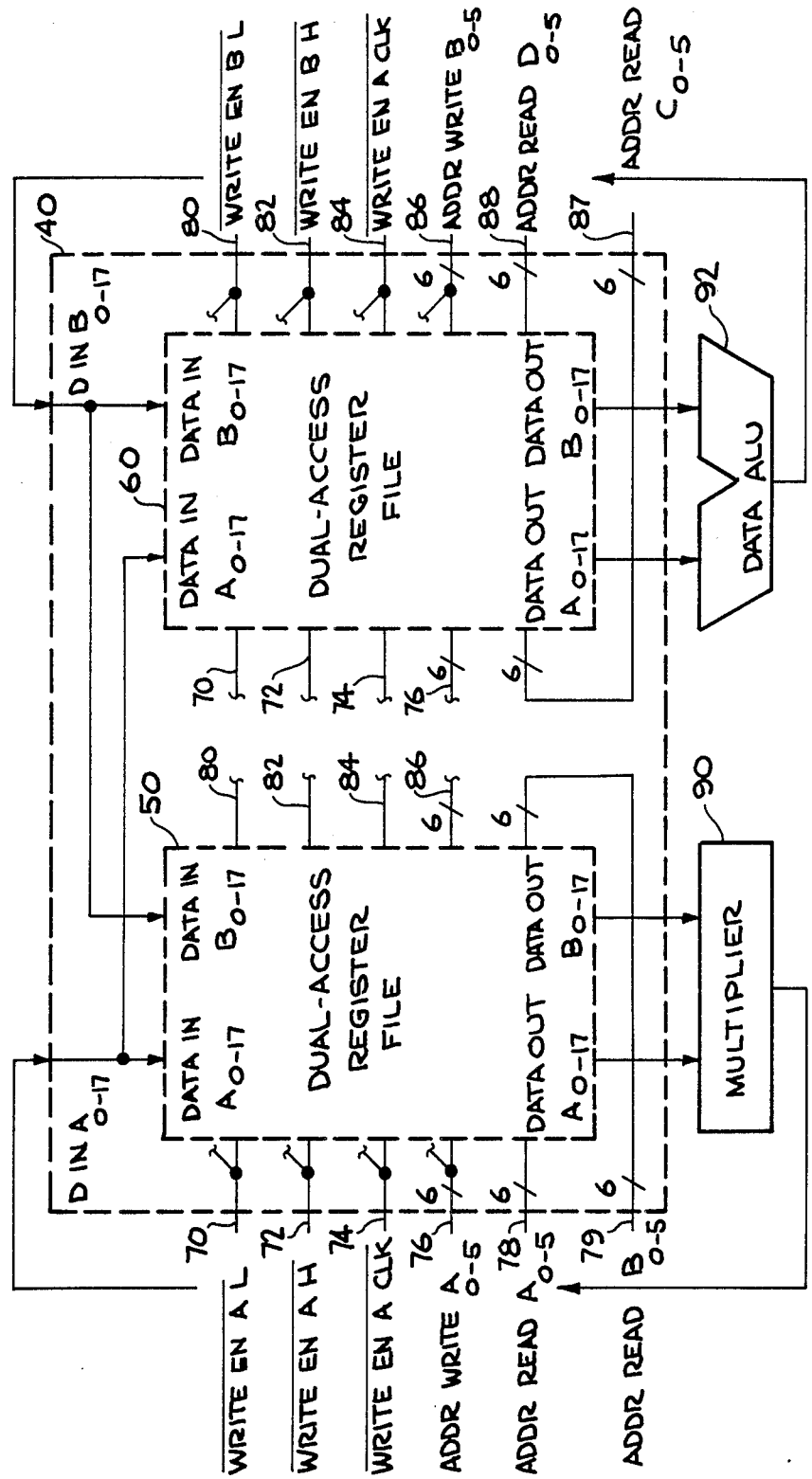
FIG. 2 illustrates the parallel connection of two register files of the present invention to form a two write-port, four read-port register file.

Since the instant invention provides a register file 10 with two write ports, parallel interconnection of the register files of the present invention is possible resulting in a dual-write port register file expandable to any number of read ports. FIG. 2 illustrates the parallel interconnection of two of the dualaccess register files shown in FIG. 1, providing a four read-port, two write-port register file 40. As shown, two four-port dual-access register files 50 and 60 of the instant invention are interconnected in parallel so that the "A"-side write enable control signals WRITE_EN_A_L, WRITE_EN_A_H, WRITE_EN_A_CLK on signal lines 70, 72 and 74, respectively, and the write addresses ADDR_WRITE_A$_{0-5}$ on bus 76 as applied to register file 40, are conducted to the corresponding "A"-side inputs of both files 50 and 60. The "B"-side write enable control signals and write addresses as applied to register file 40 via lines 80, 82 and 84 and bus 86 are similarly conducted to the corresponding "B"-side inputs of both files 50 and 60. The read addresses ADDR_READ_A$_{0-5}$ and ADDR_READ_B$_{0-5}$ are connected to file 50 via the busses 78 and 79, respectively. The read addresses ADDR_READ_C$_{0-5}$ and ADDR_READ_D$_{0-5}$ are connected to file 60 via the busses 87 and 88.

The DATA_A_IN$_{0-17}$ ports of register files 50 and 60 are similarly connected in parallel to form a D_IN_A$_{0-17}$ port for expanded register file 40. The DATA_B_IN$_{0-17}$ ports of register files 50 and 60 are similarly connected in parallel to form a D_IN_B$_{0-17}$ port. As illustrated in FIG. 2, the expanded two write-port, four read-port register file 40 can provide storage for a multiplier 90 and a data ALU 92, as might be typically used in a microcomputer. Two data values stored in register file 50 and conducted there from via the DATA_OUT_A$_{0-17}$ and the DATA_OUT_B$_{0-17}$ ports to the inputs of the multiplier 90 are combined and the resulting address is then conducted from the output of multiplier 90 to the D_IN_A$_{0-17}$ port for subsequent storage in register file 40.

Similarly, two data values stored in register file 60 and conducted there from via the DATA_OUT_A$_{0-17}$ and the DATA_OUT_B$_{0-17}$ ports to the inputs of the data ALU 92 are combined and the resulting value is then conducted from the data ALU 92 to the D_IN_B$_{0-17}$ port for subsequent storage in register file 40. Operating two register files 10 of the instant invention in parallel as shown in FIG. 2, permits treating addresses and data interchangeably, a considerable programming convenience.

We claim:

1. A dual-access single-chip integrated circuit digital storage device having at least two input port means for receiving plural-bit data words and at least two output port means for generating plural-bit words, comprising:
   random access memory (RAM) comprising a plurality of addressable plural-bit storage registers each connected to each said input port means by unidirectional busses;
   on-chip addressing means responsive to a first and second storage register address signal and a first and second bi-state read/write signal for coupling said storage register having said first address to a first predetermined one of said input port means or to a first predetermined one of said output port means depending on the state of said first read/write signal and for coupling said storage register having said second address to a second predetermined one of said input port means or to second predetermined one of said output port means depending on the state of said second read/write signal; and
   on-chip multiplex means connected to said addressing means and receiving at a first input a read address signal and at a second input a write address signal responsive to a bi-phase clock signal for selectively communicating to said addressing means said read address signal during the application of a predetermined one of said clock phase signal and said write address signal during the application of a predetermined second of said clock phase signal, and whereby, the plural-bit contents of said RAM registers selected by said first and second address signals can be communicated to a predetermined one of said at least two input port means; and
   whereby, during the application of said predetermined one of said clock phase signal the contents of said storage register having said write address is replaced by the plural-bit data word received at a predetermined one of said input port means and during the application of said predetermined second of said clock phase signal the contents of said storage register having said read address is conducted to a predetermined one of said output port means.

2. The dual-access storage device of claim 1, wherein each said plural-bit addressable register comprises a separately-addressable low-order plural-bit portion and a separately-addressable high-order plural-bit portion, further including:

a first on-chip "AND" gate having an output connected to said addressing means and receiving at a first inverting input a bi-state low-order read/write signal and receiving at a second inverting input said bi-phase clock signal, and a second on-chip "AND" gate having an output connected to said addressing means and receiving at a first inverting input a bi-state high-order read/write signal and receiving at a second inverting input said bi-phase clock signal, whereby, during the application of said predetermined one of said clock phase signal, the contents of said low-order portion of said storage register having said write address communicated to said addressing means by said multiplex means during said application of said clock phase signal is replaced by the low-order portion of said plural-bit data word received at a predetermined one for said input port means, and/or the contents of said high-order portion of said storage register is replaced by the high-order portion of said plural-bit data word received at said predetermined one of said input port means, depending on the state of said low-order read/write signal and on the state of said high-order read/write signal, respectively.

3. A dual-access digital storage device having at least two input port means for receiving plural-bit data words and at least four output port means for generating plural-bit data words, comprising:

at least a first and a second random access memory (RAM) each comprising a plurality of addressable plural-bit storage registers each connected to each said input port means and to predetermined said output port means by unidirectional busses, and addressing means responsive to a first, a second, a third, a fourth, a fifth and a sixth storage register address signal and a first and a second bi-state read/write signal for coupling said storage registers, one within each said RAM having said first address to a first predetermined one of said input port means, or for coupling said storage register within said first RAM having said second address to a first predetermined one of said output port means and for coupling said storage register within said second RAM having said third address to a second predetermined one of said output port means depending on the state of said first read/write signal and for coupling said storage registers, one within each said RAM having said fourth address to a second predetermined one of said input port means, or for coupling said storage register within said second RAM having said fifth address to a third predetermined one of said output port means, and for coupling said storage register within said first RAM having said sixth address to a fourth predetermined one of said output port means depending on the state of said second read/write signal, whereby, the plural-bit contents of said RAM registers selected by said first, respectively, said fourth address, can be replaced by said plural-bit data word at a predetermined one, respectively, a predetermined second, of said at least two input port means, whereby, the plural-bit contents of said registers within said first RAM selected by said second, respectively, said fifth address, can be conducted to a predetermined one, respectively, a predetermined second, of said at least four output port means, and whereby, the plural-bit contents of said registers within said second RAM selected by said third, respectively, said sixth address, can be conducted to a predetermined third, respectively, a predetermined fourth, of said at least four output port means.

4. The at least two input port, at least four output port dual-access digital storage device of claim 3, formed from a parallel connection of at least a first and a second dual-access single-chip integrated circuit digital storage devices each having at least two input port means for receiving plural-bit data words and at least two output port means for generating plural-bit data words, each said single-chip storage device comprising:

random access memory (RAM) comprising a plurality of addressable plural-bit storage registers each connected to each said input port means and to each said output port means of said single-chip storage device by unidirectional busses, and on-chip adressing means responsive to said storage register address signals and said bi-state read/write signal for coupling said storage register within said RAM of said first single-chip storage device having said first, respectively, fourth, address to a first, respectively, a second, predetermined one of said first single-chip storage device input port means, or for coupling said storage register within said RAM of said first single-chip storage device having said second address to a first predetermined one of said first single-chip storage device output means and for coupling said storage register within said RAM of said second single-chip storage device having said third address to a first predetermined one of said second single-chip storage device output means, depending on the state of said first read/write signal, and for coupling said storage register within said RAM of said second single-chip storage device having said first, respectively, fourth, address to a first, respectively, second, predetermined one of said second single-chip storage device input port means, or for coupling said storage register within said RAM of said second single-chip storage device having said fifth address to a second predetermined one of said second single-chip storage output means and for coupling said storage register within said RAM of said second single-chip storage device having said sixth address to a second predetermined one of said first single-chip storage output means, depending on the state of said second read/write signal, wherein each of said at least two input port means of each said single-chip storage device are connected in parallel to form each of said at least two input port means of said device of claim 3, each of said at least two output means of each single-chip storage dvice forming each of said at least four output port means of said device of claim 3, and said RAM of said first, respectively, said second, single-chip storage device forming said first, respectively, said second, RAM of said device of claim 3.

5. The at least two input port, at least four output port dual-access digital storage device of claim 4, wherein each of said single-chip storage devices further includes on-chip multiplex means connected to said single-chip storage device addressing means and receiving at a first input a read address signal and at a second input a write address signal responsive to a bi-phase clock signal for selectively communicating to said single-chip storage device addressing means said read address signal during the application of a predetermined one of said clock phase signal and said write address signal during the application of a predetermined second of said clock phase signal, whereby, during the application of said predetermined one of said clock phase signal the contents of said at least two storage registers, one within each said RAM having said write address is replaced by the plural-bit data word received at a predetermined one of said single-chip storage device input port means and during the application of said predetermined second of said clock phase signal the contents of said storage registers, one within each said RAM having said read address is conducted to a predetermined one of said single-chip storage device output ports means, wherein each of said write address signals and bi-phase clock signals are applied in parallel to each of said on-chip multiplex means of each said single-chip storage device.

6. The at least two input port, at least four output port dual-access digital storage device of claim 5, wherein each said single-chip storage device plural-bit addressable register comprises a separately-addressable low-order plural-bit portion, each said single-chip storage device further including:

a first on-chip "AND" gate having an output connected to said single-chip storage device addressing means and receiving at a first inverting input a bi-state low-order read/write signal and receiving at a second inverting input said bi-phase clock signal; and a second on-chip "AND" gate have an output connected to said single-chip storage device addressing means and receiving at a first inverting input a bi-state high-order read/write signal and receiving at a second inverting input said bi-phase clock signal, whereby, during the application of said predetermined one of said clock phase signal, the contents of said storage registers, one within each said RAM having said write address communicated to said single-chip storage device addressing means by said multiplex means during said application of said clock phase signal is replaced by the low-order portion of said plural-bit data word received at a predetermined one of said single-chip input port means, and/or the contents of said high-order portion of said storage registers, one within each said RAM is replaced by the high-order portion of said plural-bit data word reaceived at said predetermined one of said single-chip storage device input port means, depending on the state of said low-order read/write signal and on the state of said high-order read/write signal, respectively, and wherein each of said low-order and high-order read/write signals are applied in parallel to each of said on-chip "AND" gates of each said single-chip storage device.

* * * * *